United States Patent [19]

Budd et al.

[11] 3,793,064

[45] Feb. 19, 1974

[54] PRODUCT AND PROCESS FOR CAVITY METALLIZATION OF SEMICONDUCTOR PACKAGES

[75] Inventors: Joseph Paul Budd, Grand Island, N.Y.; Wayne Keith Robson, Newark, Del.

[73] Assignee: E. I. du Pont de Nemours and Company, Wilmington, Del.

[22] Filed: Nov. 15, 1971

[21] Appl. No.: 198,584

[52] U.S. Cl. ..................... 117/217, 29/625, 29/627, 117/227, 117/212, 252/514

[51] Int. Cl. ..................... B44d 1/02, B44d 1/14

[58] Field of Search .... 117/212, 217, 227; 252/514; 29/625, 627

[56] References Cited

UNITED STATES PATENTS

| | | | |
|---|---|---|---|
| 3,347,799 | 10/1967 | Wagner | 117/227 |
| 3,385,799 | 5/1968 | Hoffman | 117/227 |
| 3,407,081 | 10/1969 | Ballard | 252/514 |
| 3,458,930 | 8/1969 | Melkeraaen et al. | 29/627 |
| 3,520,054 | 7/1970 | Pensack et al. | 29/625 |
| 3,609,105 | 9/1971 | Cole, Jr. | 117/227 |

*Primary Examiner*—Cameron K. Weiffenbach
*Attorney, Agent, or Firm*—Richard H. Burgess

[57] ABSTRACT

A process and composition are provided for the gold metallization of the bottoms of cavities in semiconductor packages wherein the walls of such cavities are left free from gold which might otherwise create short circuits between the face of the package and the bottom of the cavity. Semiconductor packages provided by the use of this process are different from and preferred over packages produced by their prior methods.

22 Claims, 10 Drawing Figures

INVENTOR
JOSEPH PAUL BUDD
WAYNE KEITH ROBSON

BY [signature]
ATTORNEY

INVENTOR
JOSEPH PAUL BUDD
WAYNE KEITH ROBSON

BY Richard H. Burgess
ATTORNEY

PRODUCT AND PROCESS FOR CAVITY METALLIZATION OF SEMICONDUCTOR PACKAGES

BACKGROUND OF THE INVENTION

This invention relates to semiconductor packages. More specifically, it relates to the type of semiconductor package in which a cavity is provided for the semiconductor chip to facilitate uphill bonding of wire leads from the semiconductor chip to the face of the package.

It is preferable for packages for various types of semiconductor devices to provide a cavity in which the semiconductor chip fits, thereby permitting bonding of wire leads from the upper surface of the semiconductor chip upward to conductors on the face of the package. This is known as uphill wire bonding. It permits the use of wires for electrically connecting the semiconductor chip to conductors on the package without contact between the wire and the edge of the chip. Such contact would be more likely to occur if the top surface of the chip was above the conductors on the surface of the package, resulting in downhill bonding.

It is necessary to provide a means for firmly and reliably fastening the semiconductor chip in the cavity so that the semiconductor chip will not move relative to the package. This prevents breaking or shorting of the electrical contacts between selected portions of the semiconductor chip and the conductors on the package surface.

Reliable packages for semiconductor devices in which the semiconductor chip is to be firmly bonded to the bottom of a cavity have been manufactured in the past by metallizing refractory metal lines on green ceramic tape, stacking, registering and laminating the layers, and firing in a reducing atmosphere. The top layer of ceramic tape has a window punched in it to provide the cavity for placement of the semiconductor device. A metal pad is printed on the bottom layer to be registered with the bottom of the cavity, and a metallized line electrically connects the metal pad at the bottom of the cavity with one of the conductor lead pads. After nickel-plated leads are brazed on in a reducing atomsphere, the exposed metal portions of the package are electroplated with gold to provide corrosion protection and to facilitate bonding of the semiconductor chip to the pad at the bottom of the cavity.

In attaching the semiconductor chip to such a package, the chip, which is generally a silicon die, is brought in contact with the gold film at a temperature of 377° to 450°C. with mechanical or ultrasonic agitation. The silicon and gold interdiffuse until the eutectic composition (96 percent silicon, 4 percent gold by weight) is formed. At this time melting occurs. Removal of the heat causes the molten metal to freeze providing a high strength joint.

In the development of a highly reliable, new semiconductor package to be fired in air instead of in a reducing atmosphere, it was found that traditional approaches could not be used to effectively provide a gold pad at the bottom of the cavity. In these new package systems, a fired ceramic substrate, which is already provided with a cavity, is metallized with noble metal lines to provide for electrical connections to contact pads, and a thin crystallizable glass dielectric is placed over such conductors except for the finger-like portions adjacent to the cavity which remain open for making electrical connections to the semiconductor device. A sealing ring, such as of metal powder, is provided over the glass dielectric for hermetically enclosing the semiconductor chip in the cavity. The cavity, which is generally from 5 to 15 mils in depth, cannot readily be gold-metallized with conventional screen-printing techniques because of its depth and size. The usual manner in which such a cavity can be metallized is by placing a drop of low viscosity paste with dispersed gold powder and glass frit in the cavity. The drop can be made to completely fill the cavity; however, these films have a great affinity for the walls of the cavity and, after drying and firing, leave a conductive coating on such walls. The coating on the walls is undesirable because it has the potential to short with conductive fingers on the top level of the package. Alternatively, and likewise undesirable, the coatings on the walls can pull back away from the walls upon firing, leaving fragile portions that may break off causing further difficulties.

Other packages known in the trade as Cer-DIP (Ceramic-Dual-In-Line Package) have been manufactured previously. These packages have a preformed cavity which is metallized by allowing a drop of gold to spread in the cavity bottom. The gold, if spread throughout the cavity, metallized the cavity walls. This is not detrimental in this type of package because it has a glaze applied over the top surface of the substrate. The lead frame is positioned above this glaze, with the glaze precluding the possibility of the lead frame shorting to the cavity metallization. Since the aforementioned air-fireable new semiconductor package does not utilize a top glaze applied after the cavity metallization but before the lead-conductor metallizations, this approach does not solve the problem of gold on the cavity wall in the new package.

Other methods can be used to put a gold layer in the bottom of the cavity, including polymer-supported, gold-impregnated tape which may also contain glass frit. However, on heating such a tape to dispose of the polymer support which acts as a temporary organic binder, and to sinter the gold powder itself and, by means of the glass frit, to adhere it to the bottom of the cavity, deleterious residue of the temporary organic binder can remain behind. Such residue can have unwanted effects on the strength and nature of the bond between the gold and the silicon chip.

Therefore, it is desirable to have a means for obtaining a satisfactory gold metallization in the bottom of a preformed cavity in a ceramic semiconductor package without leaving gold adhering to the cavity walls.

SUMMARY OF THE INVENTION

The present invention in certain of its embodiments provides a process for the production of a semiconductor package with a mounting pad recessed in a cavity relative to a surface of the package. The mounting pad is provided by placing a quantity of a metallizing composition in the cavity, permitting the metallizing composition to spread over the bottom of the cavity, evaporating enough of the inert vehicle in the metallizing composition while the gold powder and glass frit in the metallizing composition settle to the bottom of the cavity or thereafter so that blister formation upon subsequent heating is minimized, and then heating the cavity to sinter the gold powder and glass frit in the bottom of the cavity to form the mounting pad. The metallizing composition comprises an inert vehicle with glass frit and gold powder dispersed therein, and essentially all of the gold powder has an equivalent spherical diameter of at least two microns.

Alternatively, another layer may be provided by a second metallizing composition similar to the first but not containing the glass frit. This second layer may be applied after the drying step or after the heating step, and then itself dried and heated. The metallizing composition without glass frit may be used as the only layer when a substrate is prepared properly for adherence to such a composition.

The metallizing compositions used in such processes are within this invention, preferably with viscosities less than about 10,000 centipoises, and the unique semiconductor packages produced in accordance with the invention having cavity walls essentially free from gold metal are also within the invention. Furthermore, certain types of glasses are particularly useful in the invention when their fusion temperatures are appropriate.

DETAILED DESCRIPTION OF THE PREFERRED EMBODIMENTS

The present invention solves the problems of the prior art by utilizing a metallizing composition which is formulated so as to cause the gold powder to settle rapidly and relatively evenly to the bottom of the cavity in the semiconductor package. Any material quantities of gold powder which are in the inert vehicle as the vehicle dries down the wall of the cavity will not adhere to the cavity wall.

Turning now to the drawings, the invention will be described with reference to the semiconductor package and to the apparent mechanisms of the process.

Figure 1:
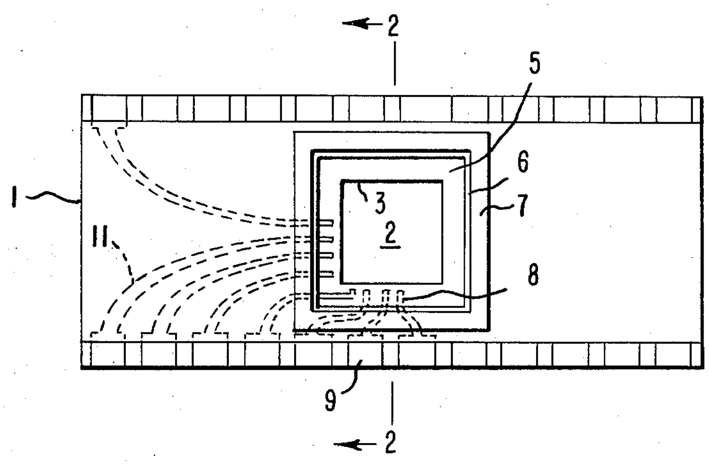
FIG. 1 is a plan view of a semiconductor package utilizing the invention.

FIG. 1 shows a multi-lead semiconductor package formed from a ceramic substrate 1 preferably of alumina which has a cavity with walls 3 and gold mounting pad 2 for the mounting of a semiconductor device or chip such as a silicon die. The cavity 4 is seen best in vertical section in FIG. 2 which also shows at 2A the upper and lower layers of pad 2. Above wall 3 an open lip 5 is maintained on the alumina substrate between wall 3 of cavity 4 and metallized fingers 6. Metallized fingers 6 are connected by means of metallized conductors 11 to contact pads 8 under a hermetically sealed layer of crystallizable vitreous material 7. Only some of metallized fingers 6 and metallized conductors 11 are illustrated. Of course, other patterns and shapes can be used within the invention. A seal ring 9 of a suitable material such as glass, metal powder or a combination thereof, can be used over vitreous layer 7 to provide a means for hermetically sealing a cap over cavity 4 after the semiconductor device has been mounted therein and electrically connected to metallized fingers 6.

Figure 2:
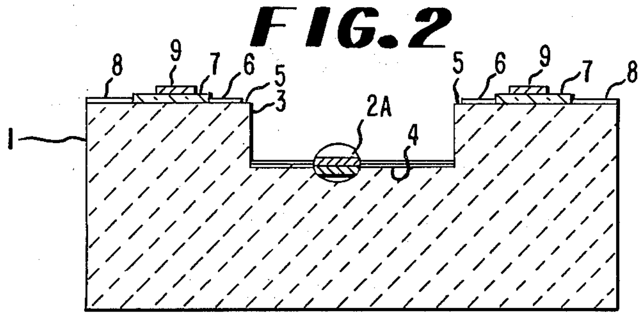
FIG. 2 is a vertical section through the semiconductor package of FIG. 1 at 2—2.
Figure 3:
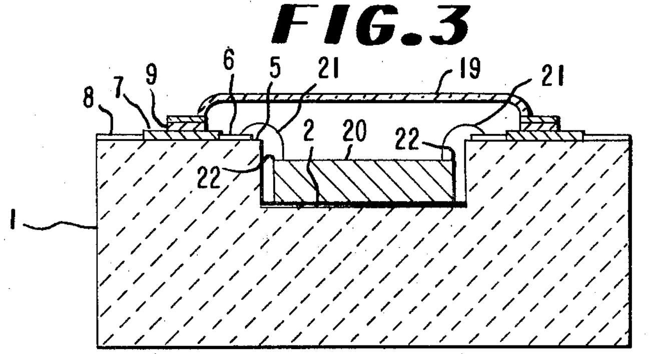
FIG. 3 shows a semiconductor package utilizing the invention in which a semiconductor device has been bonded and electrically connected, and which has been hermetically sealed with a cover.
Figure 4A:
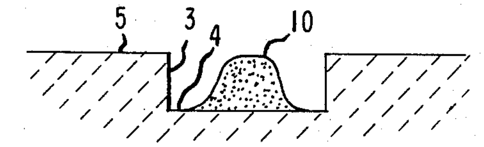
FIGS. 4A and B, 5A and B, 6, 7 and 8 show schematic illustrations of progressive stages in the metallization of package cavities in accordance with the invention.
Figure 4B:
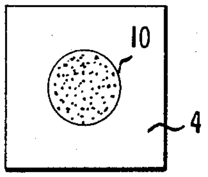
Figure 5A:
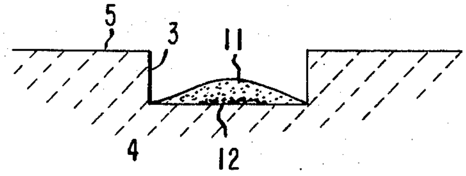
Figure 5B:
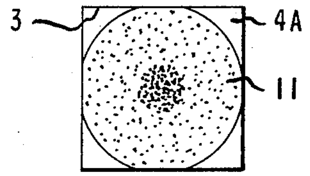
Figure 6:
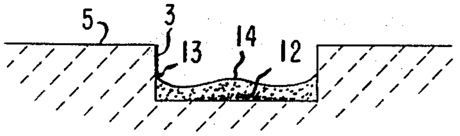
Figure 7:
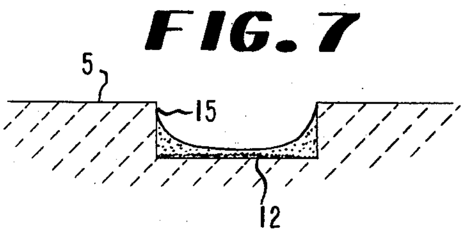

FIG. 3 shows the package of FIG. 2 which has had a semiconductive device 20 sealed to gold mounting pad 2 and connected to metallized fingers 6 by lead wires 21 and then has been hermetically sealed such as by a gold-plated Kovar metal cap 19 which is soldered to a gold seal ring 9. FIG. 3 also illustrates uphill bonding of lead wires 21 whereby the upper edge 22 of the silicon die 20 is not liable to be contacted by lead wire 21 as determined by the relative positions of the silicon die and the lip 5 of the ceramic substrate. Of course it will be understood that various materials of construction can be used for parts of the semiconductor package without imparing the utility of the invention, such parts including ceramic substrate 1, crystallizable vitreous material 7, metallized fingers 6, conductors 11, contact pads 8, seal ring 9, and cap 19. Other materials that could be used for the substrate include glazed as well as unglazed alumina, glasses, sapphire, beryllia, steatite, fosterite, zircon, and other ceramics. Such materials may also be coated, such as with a layer of a glass powder for increasing the adhesion of the bonding pad to the substrate.

For a better understanding of the complexity of the present invention, FIGS. 4 through 8 illustrate the process of settling and drying of metallizing compositions within a cavity. Although the apparent operation of the invention is illustrated by these figures, it should be understood that the invention does not depend upon any particular theory or the details thereof. As seen in FIG. 4A, a drop of metallizing composition 10 has been placed on the bottom of cavity 4. The wall 3 and lip 5 of the semiconductor package are also shown. The drop of metallizing composition can suitably be dispensed by a pressure pulse of 15 pounds per square inch through a 1 inch long plastic or metal needle having an internal diameter of from 6 to 16 mils. A one-second pressure pulse produces a drop or squirt of metallizing composition in such a needle satisfactory for metallizing the bottom of a cavity which is 0.2 inches square and 0.015 inch deep. FIG. 4B shows how the drop is initially located in the center of cavity 4. In a short amount of time, the drop has spread out as shown in FIGS. 5A and 5B to a point where it contacts the walls 3 but not necessarily the corners 4A. Gold powder 12 has already begun to fall from the metallizing composition, mixed with glass powder when it is present, to the bottom of the cavity. After a greater amount of time, the metallizing composition, which must wet the alumina substrate in order to spread fully into the corners 4A, also begins to climb the walls of the cavity as shown at 13 in FIG. 6. A higher level of metallizing composition can still be left in the middle of the cavity as at 14 at this time. It can be seen that greater concentrations of gold powder are building up at 12 in the center of the cavity. With greater amounts of time, the metallizing composition is drawn up the walls, perhaps to the top of the cavity as shown at 15 in FIG. 7. Gold powder is still dispersed in the vehicle and it continues to drop to the bottom from the portions of the vehicle in which it is dispersed. Gold particles caught on the wall 4 of the cavity should be large enough to fall freely away from the wall and not be held there by surface tension as the inert vehicle dries down the wall. Although it is possible that the present invention would be operative with some minute amounts of gold powder adhering to the wall, it is necessary that essentially no gold powder adheres to the wall, or, in other words, that no material quantities do so. Material quantities in this sense mean quantities adequate to cause shorting of the gold bonding pad to the metallization fingers.

Figure 8:
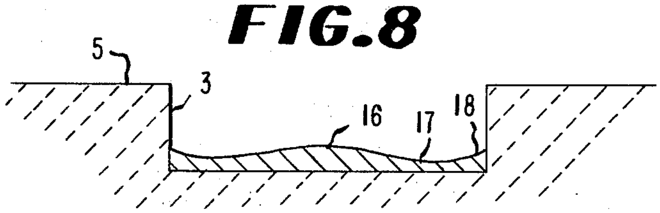

FIG. 8 illustrates in a somewhat exaggerated curvature and height the desired and normal profile of the gold pad produced in accordance with the invention after it has settled, dried, and been fired to remove the residue of the inert vehicle. There is a rise in the middle at 16 which facilitates contact with the silicon die which is vibrated at elevated temperature to form the eutectic, as described above. The dip at 17 is not harmful, and in fact is useful in providing a localized initial contact with the die at the higher center elevation 16. A small rise 18 in the gold layer at the walls is not harmful and can also assist in ultimately creating a complete bond of the silicon die in the cavity. The profile, sintering and bonding characteristics, the confinement to the bottom of the cavity, and other properties of this gold pad are superior to those of the prior art.

It will be seen from the above discussion that it is necessary for the inert vehicle of the metallizing composition to wet the alumina substrate well. However, it is desirable to avoid any cracks or extraneous materials on the walls 4 or the corner between the wall 3 and the lip 5, since such discontinuities and other matter might enhance wicking of the inert vehicle carrying the gold powder out of the cavity onto the top surface 5 where shorting with the metallized fingers would be much more likely.

Gold powders can come in various morphologies, including individual spherical particles, agglomerates of spherical and other shapes of particles, and plates of generally triangular or hexagonal form. The ability of the gold powder particles to settle in the inert vehicles of the present invention, and the ability of the powders to fall away from the wall as the vehicle dries are determined in large part by the Stokes Law relationship of the particles to the properties of the metallizing composition in general, particularly to the viscosity of the inert vehicle. An equivalent spherical diameter of at least about 2 microns produces the desirable results of the invention, while particles much smaller than that either do not settle with adequate rapidity, or adhere deleteriously to the walls of the cavity, or do not sinter properly upon heating to give coatings of good integrity. Likewise, the viscosity of the inert vehicle should be below about 5,000 centipoises to provide for settling with adequate rapidity. Such vehicles are generally inadequately viscous for use in silk screening. The drying characteristics of the inert vehicle can vary considerably with good results still being obtainable. For commercial practices, it has been found desirable to formulate a metallizing composition that will spread and settle adequately at room temperature in about 10 minutes and then dry at a higher temperature such as 125° C. in another 10 minutes to avoid deleterious amounts of bubbling or blistering upon firing at 700° to 1,000°C. to remove any residue of the inert vehicle and to sinter the gold powder and glass frit together and to the bottom of the cavity.

The equivalent spherical diameter of powder particles is determined in accordance with Stoke's Law as presented in *Principles of Mineral Dressing* by A. M. Gaudin, McGraw-Hill 1939, pp. 194–198 and Chapter VIII; *Principles of Chemical Engineering*, by W. H. Walker, W. K. Lewis, W. H. McAdams, E. R. Gilliland, McGraw-Hill, 1937, pp. 296–302; and *Mineral Preparation Notebook* by H. B. Charmbury, The Pennsylvania State University, 1956, pp. 63–68. The equivalent spherical diameter of a non-spherical particle is the diameter of a sphere that will settle in a fluid at the same velocity as the irregular particle. In normal flakey gold powders, a 2.65 $\mu$ wide plate has the same settling velocity as a 2 $\mu$ sphere; therefore, the plate has an equivalent spherical diameter of 2 $\mu$. Stoke's law is $$V_m = 2(D\text{-}D')r^2\, g/9\, \mu\, F^2 \text{ for spheres}$$

where $D$ = particle density in gm/cc
$D'$ = fluid density in gm/cc
$r$ = radius of an equivalent spherical particle in cm
$g$ = acceleration of gravity cm/sec$^2$
$\mu$ = viscosity of the fluid in poise
$V_m$ = settling velocity in cm/sec
$F$ = geometry factor:
1 for spheres
1.19 for cubes
1.28 for very thin disks
1.24 for ordinary flakey gold powder The procedure for measuring the equivalent spherical diameter involves dispersing the powder in a fluid and measuring the settling rate of the particles. The above equations can then be used to calculate the equivalent spherical diameter or radius of the particle. The proportions and shapes of spherical and non-spherical particles can be determined from photomicrographs of the particles. Those skilled in the art will be able to choose appropriate values for the geometry factor, F.

In the metallizing compositions of the invention, the solids (gold powder and glass frit) can be adjusted to give the desired thickness, adherence, and other characteristics sought. The components of the inert vehicle can be adjusted to control the spreading rate of the drop and the drying time. At least 0.1 percent of glass frit in the metallizing composition contacting the ceramic has been found to be desirable to provide adhesion to the ceramic substrate. Higher levels of glass increase adhesion to the substrate, but tend to retard the formation of the Si-Au eutectic. The preferred range is 0.8 to 6 percent glass by weight when a one-layer system is used for adhesion to both the alumina substrate and the ceramic chip. Glass frits for use in the invention preferably have crystallizing or softening points in the range of 400° to 1,000°C. The content of gold powder is 40 to 88 percent by weight with at least about 10 percent by weight of the temporary organic binder which is the portion of the inert vehicle other than the solvents. For the metallizing compositions not containing glass frit, the preferred content of gold powder is 50 to 99 percent by weight. Higher solids contents increase the print thickness and reduce spreading. Higher contents of temporary organic binder also reduce spreading. Although many types of vehicles can satisfactorily serve the purposes of the invention, the invention preferably makes use of substituted cellulose such as ethyl cellulose or ethyl-hydroxyethyl cellulose dissolved in one or more organic solvents such as kerosene and turpene resins. Suitable inert vehicles are also described in U.S. Pat. No. 3,536,508; Short.

As will be apparent to those skilled in the art, optimum results can be obtained by carefully selecting the vehicle viscosity to give a practical settling rate with the gold powder being used. For instance, the distance that gold particles of specified equivalent spherical diameter will settle in ten minutes in vehicles of specified viscosities is given in Table I below.

TABLE I

Settling of Gold Powders

| Vehicle Viscosity (centipoises) | Powder Particle Diameter ($\mu$) | Settling Distance (mils/10 min.) |
|---|---|---|
| 1000 | 1 | 0.25 |
| Do. | 2 | 1.0 |
| Do. | 3 | 2.1 |
| Do. | 6 | 8.5 |
| 5000 | 1 | 0.06 |
| Do. | 2 | 0.2 |
| Do. | 3 | 0.4 |
| Do. | 6 | 1.8 |
| 10,000 | 1 | 0.03 |
| Do. | 2 | 0.1 |
| Do. | 3 | 2 |
| Do. | 6 | 9 |

If a minimum practical settling rate for commercial purpose is thought to be about 1 mil in 10 minutes, this can be achieved with 1,000 centipoise vehicle and 2 $\mu$ particles, 5,000 centipoise vehicle and about 4 $\mu$ particles, or 10,000 centipoise vehicle and about 6 $\mu$ particles.

For the forming of desirable films, gold powder having an equivalent spherical diameter of less than 10 microns is preferred. Even for gold powders as large as 10 microns, practical settling rates are obtained with vehicles having viscosities less than or not much more than 10,000 centipoises.

To minimize the time necessary to form the Si-Au eutectic in bonding the silicon semiconductor device in the cavity, an unfritted overlayer of gold can be used over the first layer of gold.

When the substrate is adequately adherent to the gold powder, such as when the alumina is glazed with a glass that softens at the temperatures used to fire the gold layer, it is not necessary that the gold layer contain glass frit. As shown in exploded section 2A of FIG. 2 of the drawings, the pad 2 at the bottom of the cavity 4 has upper and lower layers. The first layer, which is on the bottom of the cavity, can be a glass frit and have from 0 to 90 percent gold by weight mixed in with the glass frit. A useful embodiment of this aspect of the invention involves putting down a first layer of a suitable glass frit without any gold in a vehicle, drying it, and then putting down a layer of unfritted gold powder, drying it, and then firing the whole assembly at temperatures suitable to fuse the glass and sinter the gold. The glasses described hereinafter are suitable for these purposes.

The following examples provide further teachings of the operation of the present invention. In these examples, the viscosity of the vehicle was about 1,000 to 1,100 centipoises, measured on a Brookfield RVT-4 viscometer at 10 revolutions per minute. The compositions of the glasses used as frits and the specifications of the gold powders used in the metallizing compositions are set forth in Tables II and III, respectively, and the procedure used to prepare gold powder A, which is useful in the invention, is described after Table III. Percentages herein are by weight except where indicated otherwise.

EXAMPLE 1

A low viscosity paste was prepared by mulling 3.76 g. of zinc borosilicate glass frit A and 50.2 g. of gold powder A which consisted of generally spherical particles having an average equivalent spherical diameter of 2.6 $\mu$ and a minimal equivalent spherical diameter of 2 $\mu$ with 16.6 g. of a vehicle of ethyl hydroxyethyl cellulose dissolved in beta terpineol and kerosene, 13.4 g. butyl carbitol acetate and 16.04 g. more beta terpineol. A drop of this material was placed in a cavity of a 96 percent $Al_2O_3$ substrate by using the end of a spatula. Any suitable alumina substrate used commercially as a semiconductor package could have been used. The particular material used is characterized as 96 percent alumina, formed by dry pressing and firing at about 1,600°C. The balance of the composition is conventional impurities and glasses and sintering-promotion additives such as $SiO_2$, MgO and CaO contained in dry pressed ceramics for use in the electronics industry. The drop completely filled the cavity which was 0.200 × 0.200 × 0.015 in. deep within 2 minutes. After 10 minutes, the solvents were evaporated by forced air evaporation at 125°C. The alumina substrate was then placed in a tunnel kiln which reached a peak temperature of 890°C. in 20 minutes, with 10 minutes at 890°C., and then returned to room temperature over the next 10 minutes. The glass content of this metallizing composition provided a good bond to the alumina substrate and permitted its use as an underlayer to be overcoated with a second metallizing composition of unfritted gold powder, as described in Example 2. However, the type and amount of glass in this underlayer did not permit the formation of a good Si-Au eutectic bond upon scrubbing with a silicon die directly on it.

EXAMPLE 2

A second composition was made using 38 g. of the gold powder A, 10 g. of the inert vehicle of Example 1, plus, as additional solvents, 65 g. of butyl carbitol acetate and 6 g. of beta-terpineol. A drop of this composition was placed in the center of a cavity containing the film produced in accordance with Example 1. The drop spread to cover the entire cavity bottom. The composition was dried and fired as was done in Example 1. The resultant film was dense in appearance, bright and shiny, and was not present on the cavity walls. Manual scrubbing with a silicon die gave Si-Au eutectic formation within 5 seconds at a temperature of 410°C. This film gave performance similar to a gold-plated film, the industry standard.

EXAMPLE 3

The procedure of Examples 1 and 2 was repeated in sequence except that the application was made by pressure through a 16 mil inside diameter plastic tube. The volume dispensed was controlled by adjusting pressure and duration of the pressure pulse. Fifteen pounds per square inch for five-sixths second for the second layer and for 1 second for the second layer satisfactorily filled the cavity. The desirable results of Example 2 were again obtained.

EXAMPLE 4

The procedure of Example 3 was repeated with 96 percent $Al_2O_3$ substrate having a cavity of 0.350 ×

0.350 × 0.015 in. deep. A pressure pulse of 15 pounds per square inch for 1 second adequately filled the cavity, and the results were quite satisfactory.

EXAMPLE 5

The procedure of Example 3 was repeated substituting zinc-lead silicate glass frit B for the zinc-borosilicate glass frit A. Identical satisfactory results were obtained.

EXAMPLE 6

A low viscosity composition was formulated and applied as in Example 1, except that 65 percent of gold powder A and 6 percent of a lead borate glass frit C were used, the balance being the inert vehicle. Satisfactory results were obtained in bonding a silicon die directly to this fritted gold layer without the necessity of an unfritted overprint, with the eutectic bond forming in 3 seconds at 450°C.

EXAMPLE 7

The procedure of Example 6 was repeated except using 67 percent of a gold powder A and 2 percent of lead borate glass frit C. Die bonding time was markedly improved over Example 6, with the bond forming in 2 seconds at 450°C., and adhesion of the gold film to the silicon die was so strong that in shear testing of the die, the die fractured before the gold lost adhesion from the ceramic.

EXAMPLE 8

The procedure of Example 7 was repeated except that the gold content was 50 and 2 percent of the lead borate frit was used. Die bonding did not occur as readily as in Example 7, but it was adequate, 3 seconds being required at 450°C. to form the eutectic bond. Upon shear testing the die fractured, indicating good adhesion of the film to the ceramic and good soldering of the die to the gold pad.

EXAMPLE 9

The procedure of Example 8 was carried out with 40 percent gold powder by weight. The resulting fired film appeared lacey with backlighting indicating that the film was not as thick and uniform as would be desirable. Eutectic alloying did not occur readily. However, use of a Si-Au preform between the silicon die and the gold pad enhanced eutectic formation and gave excellent die bond strength, similar to that of Example 8.

PROCEDURE I

The procedure of Example 3 was repeated except that gold powder B was used. It consisted of about 80 percent spherical particles and 20 percent plates, having an average equivalent spherical diameter of 0.6 $\mu$ and a minimum equivalent spherical diameter of 0.5 $\mu$. An unsatisfactorily large amount of gold adhered to the cavity walls because of the presence of material quantities of gold powder particles that were too small.

PROCEDURE II

The procedure of Example 3 was repeated using 50 percent gold powder I and 50 percent gold powder B. Unsatisfactorily large quantities of gold adhered to the cavity walls.

PROCEDURE III

The procedure of Example 3 was followed except that gold powder C was substituted for gold powder A and glass C was used instead of glass A. An unsatisfactory amount of gold adhered to the cavity walls, and the gold film cracked after firing because of the presence of material quantities of gold powder particles that were too small.

TABLE II

GLASS FRIT COMPOSITIONS

| Glass | Type | Constituent | Weight Percent |
|---|---|---|---|
| A | Zinc borosilicate softening pt. 613°C. | ZnO | 27.7 |
| | | $B_2O_3$ | 26.7 |
| | | $SiO_2$ | 21.7 |
| | | $Na_2O$ | 8.7 |
| | | $Al_2O_3$ | 5.8 |
| | | $ZrO_2$ | 4.0 |
| | | CaO | 3.9 |
| | | BaO | 0.8 |
| | | PbO | 0.7 |
| B | Zinc-lead silicate crystallizing temp. 820° to 860°C. | ZnO | 10 |
| | | PbO | 32 |
| | | $SiO_2$ | 30 |
| | | BaO | 8 |
| | | $Al_2O_3$ | 11 |
| | | $TiO_2$ | 9 |
| C | Lead borate softening pt. 420°C. | PbO | 66.9 |
| | | $B_2O_3$ | 12.3 |
| | | $SiO_2$ | 10.3 |
| | | CdO | 6.8 |
| | | NaF | 3.5 |
| | | $Al_2O_3$ | 0.2 |

TABLE III

GOLD METAL POWDERS

| Specifications | Powder A | Powder B | Powder C |
|---|---|---|---|
| Average equivalent spherical diameter ($\mu$) | 2.6 | 0.6 | 1.04 |
| Minimum equivalent spherical diameter ($\mu$) | 2.0 | 0.5 | 0.80 |
| Surface Area ($m^2/g$) | 0.10–0.15 | 0.4–0.7 | 0.15–0.30 |
| Morphology | spheres | 80% spheres, 20% plates* | spheres |

*The maximum measurement across the flat surfaces of the plates was 3 to 6 times the thickness of the plates.

Gold powder A was prepared in accordance with the following procedure:

A gold chloride solution was prepared by dissolving 300 g. of metallic gold in aqua regia. By successive boil downs of this solution and with several additions of HCl, the oxides of nitrogen were removed; 5 liters of water were then added to the dissolved gold. In a separate container, 700 g. of potassium sulfite crystals were dissolved in 5 liters of cold water. Then the gold chloride solution was slowly agitated while the potassium sulfite solution was poured into the gold chloride solution as rapidly as possible. The reaction proceeded very rapidly with no bubbling or frothing. The temperature of the solution was maintained at approximately 20°C.

The reaction was complete in less than 1 minute. The entire batch was filtered on a sintered glass filter plate and washed with water until the precipitated gold was free of the sulfite and sulfate ions. The gold powder was then washed in methanol to remove the water; the powder was then dried at room temperature.

The gold powder was weighed and found to contain 296 grams of spherical particles; the bulk density was approximately 8.0 gm/cc and the micron size ranged from 2–3 microns.

What is claimed is:

1. In a semiconductor package comprising a substrate having a plurality of metallized conductors thereon and a cavity recessed therein, and a mounting pad disposed on the bottom of said cavity for mounting a semiconductor chip, said pad comprising a fired layer of a gold metallization composition consisting essentially of at least 0.1 percent, by weight, glass frit and at least 40 percent, by weight, gold powder dispersed in an inert vehicle, essentially all of said gold powder having an equivalent spherical diameter of at least about 2 microns, wherein the walls of said cavity are substantially free of said fired layer.

2. In a semiconductor package comprising a substrate having a plurality of metallized conductors thereon and a cavity recessed therein, and a mounting pad disposed on the bottom of said cavity for mounting a semiconductor chip, said pad comprising fired layers of a first composition consisting essentially of a glass frit in a vehicle, and a second gold metallization composition consisting essentially of at least 50 percent, by weight, gold powder dispersed in an inert vehicle, essentially all of said powder having an equivalent spherical diameter of at least about 2 microns, wherein the walls of said cavity are substantially free of said fired layers.

3. In a semiconductor package comprising a substrate having a plurality of metallized conductors thereon and a cavity recessed therein, and a mounting pad disposed on the bottom of said cavity for mounting a semiconductor chip, said pad comprising fired layers of a first gold metallization consisting essentially of at least 0.1 percent, by weight, glass frit and at least 40 percent, by weight, gold powder dispersed in an inert vehicle, and a second gold metallization composition consisting essentially of at least about 50 percent gold powder, by weight, dispersed in an inert vehicle, essentially all of said gold powder having an equivalent spherical diameter of at least about 2 microns, wherein the walls of said cavity are substantially free of said fired layers.

4. In a process for producing a mounting pad in a semiconductor chip package, said package comprising a substrate having a plurality of metallized conductors thereon and having a cavity recessed therein for receiving a semiconductor chip, the improvement comprising the steps of:

a. placing a quantity of a metallizing composition in said cavity, said metallizing composition consisting essentially of at least 0.1 percent, by weight, glass frit and at least 40 percent, by weight, gold powder dispersed in an inert vehicle, essentially all of said gold powder having an equivalent spherical diameter of at least about 2 microns, b. permitting said metallizing composition to spread over the bottom of said cavity and said gold powder to settle thereon, c. evaporating enough of said inert vehicle so that blister formation upon subsequent heating is minimized, and d. heating said cavity to sinter said metallizing composition in the bottom of said cavity to form said mounting pad, and leaving the walls of said cavity substantially free of said sintered metallizing composition.

5. A process according to claim 4 in which said metallizing composition contains, by weight, about 0.8 to 6 percent glass frit and 40 to 88 percent gold powder.

6. A process according to claim 4 in which said metallizing composition has a viscosity of less than about 10,000 centipoises.

7. A process according to claim 4 in which said glass frit crystallizes or has a softening point in the temperature range of 400° to 1,000°C.

8. A process according to claim 4 in which said inert vehicle comprises substituted cellulose dissolved in an organic solvent.

9. A process according to claim 4 in which the evaporating of step (c) is performed at 100° to 150°C. and the heating of step (d) is performed at 700 to 1,000°C.

10. In a process for producing a mounting pad in a semiconductor chip package, said package comprising a substrate having a plurality of metallized conductors thereon, and having a cavity recessed therein for receiving a semiconductor chip, and said cavity having a first layer of glass frit on a bottom surface, the improvement comprising the steps of:

a. placing a quantity of a metallizing composition in said cavity, said metallizing composition consisting essentially of at least 50 percent, by weight, gold powder dispersed in an inert vehicle, essentially all of said gold powder having an equivalent spherical diameter of at least about 2 microns, b. permitting said metallizing composition to spread over the bottom of said cavity and said gold powder to settle thereon, c. evaporating enough of said inert vehicle so that blister formation upon subsequent heating is minimized, and d. heating said cavity to sinter said metallizing composition in the bottom of said cavity to form said mounting pad, and leaving the walls of said cavity substantially free of said sintered metallizing composition.

11. A process according to claim 10 in which said metallizing composition contains, by weight, 50 to 90 percent gold powder.

12. A process according to claim 10 in which said metallizing composition has a viscosity of less than about 10,000 centipoises.

13. A process according to claim 10 in which said glass frit crystallizes or has a softening point in the temperature range of 400° to 1,000°C.

14. A process according to claim 10 in which said inert vehicle comprises substituted cellulose dissolved in an organic solvent.

15. A process according to claim 10 in which the evaporating of step (c) is performed at 100° to 150°C. and the heating of step (d) is performed at 700° to 1,000°C.

16. In a process for producing a mounting pad in a semiconductor chip package, said package comprising a substrate having a plurality of metallized conductors thereon and having a cavity recessed therein for receiving a semiconductor chip, the improvement comprising the steps of:

a. placing a quantity of a metallizing composition in said cavity, said metallizing composition consisting essentially of at least 0.1 percent, by weight, glass frit and at least 40 percent, by weight, gold powder dispersed in an inert vehicle, essentially all of said gold powder having an equivalent spherical diameter of at least about 2 microns, b. permitting said metallizing composition to spread over the bottom of said cavity and said gold powder to settle thereon, c. evaporating enough of said inert vehicle so that blister formation upon subsequent heating is minimized, d. placing a quantity of a second metallizing composition in said cavity on top of said first metallizing composition, said second metallizing composition consisting essentially of at least about 50 percent, by weight, gold powder dispersed in an inert vehicle, essentially all of said gold powder having an equivalent spherical diameter of at least about 2 microns, e. permitting said second metallizing composition to spread over said first metallizing composition and said gold powder to settle thereon, f. evaporating enough of said inert vehicle so that blister formation upon subsequent heating is minimized, and g. heating said cavity to sinter said first and second metallizing composition in the bottom of said cavity to form said mounting pad, leaving the walls of said cavity substantially free of said sintered metallizing composition.

17. A process according to claim 16 in which said cavity is heated to sinter said first metallizing composition between steps (c) and (d).

18. A process according to claim 16 in which said first metallizing composition contains, by weight, about 0.8 to 6 percent glass frit and 40 to 88 percent gold powder and said second metallizing composition contains about 50 to 90 percent gold powder.

19. A process according to claim 16 in which said metallizing composition has a viscosity of less than about 10,000 centipoises.

20. A process according to claim 16 in which said glass frit crystallizes or has a softening point in the temperature range of 400 to 1,000 C.

21. A process according to claim 16 in which said inert vehicle comprises substituted cellulose dissolved in an organic solvent.

22. A process according to claim 16 in which the evaporating of steps (c) and (f) is performed at 100° to 150°C. and the heating of step (g) is performed at 700° to 1000°C.

* * * * *